United States Patent
Lee et al.

(10) Patent No.: US 7,336,721 B2
(45) Date of Patent: Feb. 26, 2008

(54) DIGITAL FREQUENCY MODULATOR

(75) Inventors: Kyung-Ha Lee, Seoul (KR); Soo-Bok Yeo, Songnam-shi (KR)

(73) Assignee: Samsung Electronics Co., Ltd (KR)

( * ) Notice: Subject to any disclaimer, the term of this patent is extended or adjusted under 35 U.S.C. 154(b) by 792 days.

(21) Appl. No.: 10/320,182

(22) Filed: Dec. 16, 2002

(65) Prior Publication Data
US 2003/0112893 A1    Jun. 19, 2003

(30) Foreign Application Priority Data
Dec. 15, 2001    (KR) ...................... 10-2001-0079758

(51) Int. Cl.
*H04L 27/00* (2006.01)
(52) U.S. Cl. ...................... 375/295; 375/302
(58) Field of Classification Search ........ 332/117–143; 375/295, 302, 316, 147
See application file for complete search history.

(56) References Cited

U.S. PATENT DOCUMENTS

| | | | | |
|---|---|---|---|---|
| 5,057,796 A | * | 10/1991 | Winterer | ...................... 332/114 |
| 5,091,705 A | * | 2/1992 | Hiramatsu et al. | .......... 332/103 |
| 5,225,795 A | * | 7/1993 | Iinuma | ...................... 332/100 |
| 5,446,423 A | * | 8/1995 | Bienz et al. | ................. 332/170 |
| 5,732,002 A | * | 3/1998 | Lee et al. | .................... 708/313 |
| 5,751,198 A | * | 5/1998 | Yoshida et al. | ............. 332/100 |
| 6,265,948 B1 | * | 7/2001 | Stevenson | ................... 332/101 |
| 2002/0116181 A1 | * | 8/2002 | Khan et al. | ................. 704/205 |

* cited by examiner

*Primary Examiner*—Chieh M. Fan
*Assistant Examiner*—Jason M. Perilla
(74) *Attorney, Agent, or Firm*—The Farrell Law Firm, PC

(57) ABSTRACT

A digital frequency modulator is disclosed. In the digital frequency modulator, a first gain controller multiplies an input digital signal by a first gain determined according to a required modulation frequency, a phase accumulator accumulates the input digital signal and generates a phase accumulation according to a required phase resolution to output the phase accumulation within a predetermined output range. A second gain controller multiplies the output of the phase accumulator by a second gain determined according to the required modulation frequency and the first gain. A phase modulator outputs cosine and sine values having a phase corresponding to the second-gain controlled signal.

12 Claims, 4 Drawing Sheets

US 7,336,721 B2

DIGITAL FREQUENCY MODULATOR

PRIORITY

This application claims priority to an application entitled "Digital Frequency Modulator" filed in the Korean Industrial Property Office on Dec. 15, 2001 and assigned Serial No. 2001-79758, the contents of which are hereby incorporated by reference herein.

BACKGROUND OF THE INVENTION

1. Field of the Invention

The present invention relates generally to a frequency modulator, and in particular, to a digital frequency modulator for accumulating input digital signals and changing the phase of the accumulated signal.

2. Description of the Related Art

In general, a wireless communication system transmits on a radio channel a relatively high-frequency carrier with a relatively low-frequency input signal. This is called modulation. In particular, when the information of the input signal is contained in the frequency and phase of the carrier signal, the modulation is called frequency modulation (FM).

An analog frequency modulator illustrated in FIG. 1 is usually used as a frequency modulator. The analog frequency modulator is comprised of a gain controller 110, a digital-to-analog converter (DAC) 120, an FM filter 130, a voltage controlled oscillator (VCO) 150, and a frequency synthesizer 140.

Referring to FIG. 1, the gain controller 110 multiplies an input digital signal $V_{in}$ by a predetermined gain G. The DAC 120 converts the output of the gain controller 110 to an analog signal. The FM filter 130 filters the analog signal and feeds the filtered signal as a voltage control signal to the VCO 150. Meanwhile, the frequency synthesizer 140 generates a carrier signal with a predetermined carrier frequency. The VCO 150 controls the frequency of the carrier signal received from the frequency synthesizer 140 with the voltage control signal, thereby outputting an FM signal.

As described above, the analog frequency modulator effects FM by converting an input digital signal to an analog signal and then controlling the VCO 150 with the analog signal.

A distinctive shortcoming of the typical analog frequency modulator is that the VCO being an analog device makes performance optimization difficult due to performance variation and use of additional analog devices for stabilizing the characteristics of the VCO increases cost. The VCO has a non-linear frequency output characteristic with respect to an input signal and exhibits very different characteristics depending on devices. Thus to achieve desirable FM characteristics, compensation or adjustment is required for the VCO. As a solution to this problem, implementation of a digital frequency modulator has been considered. However, the digital frequency modulator also has the limitations of difficulty in achieving desirable resolution with respect to various frequency inputs and implementation complexity.

SUMMARY OF THE INVENTION

It is, therefore, an object of the present invention to provide a digital frequency modulator that outputs digital cosine and sine signals having a phase corresponding to an input digital signal by modulating the input digital signal.

It is another object of the present invention to provide a digital frequency modulator for controlling a modulation frequency and a frequency resolution with respect to an input digital signal having a variable rate.

To achieve the above and other objects, in a digital frequency modulator, a first gain controller multiplies an input digital signal by a first gain determined according to a required modulation frequency, and a phase accumulator accumulates the first-gain controlled signal, generates a phase accumulation with a required phase resolution to output the phase accumulation within a predetermined output range. A second gain controller multiplies the output of the phase accumulator by a second gain determined according to the required modulation frequency and the first gain. A phase modulator outputs cosine and sine values having a phase corresponding to the second-gain controlled signal.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

A digital frequency modulator for wireless communication according to the present invention outputs a digital in-phase signal and a digital quadrature-phase signal by use of a first gain controller, a phase accumulator, a second gain controller, a phase modulator having a look-up table with sine values or cosine values corresponding to phases. Components of the digital frequency modulator required to achieve the purpose and their effective implementation will be described below.

Figure 1:
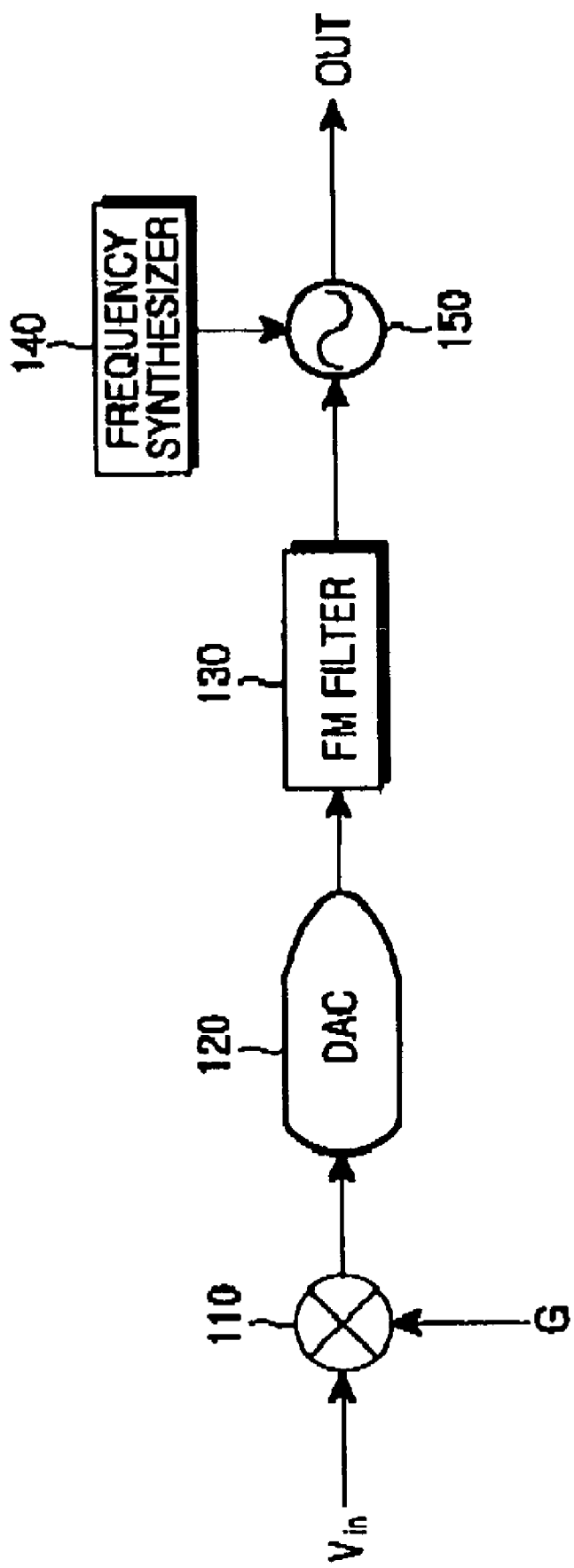
FIG. 1 is a block diagram of a typical analog frequency modulator.
Figure 2:
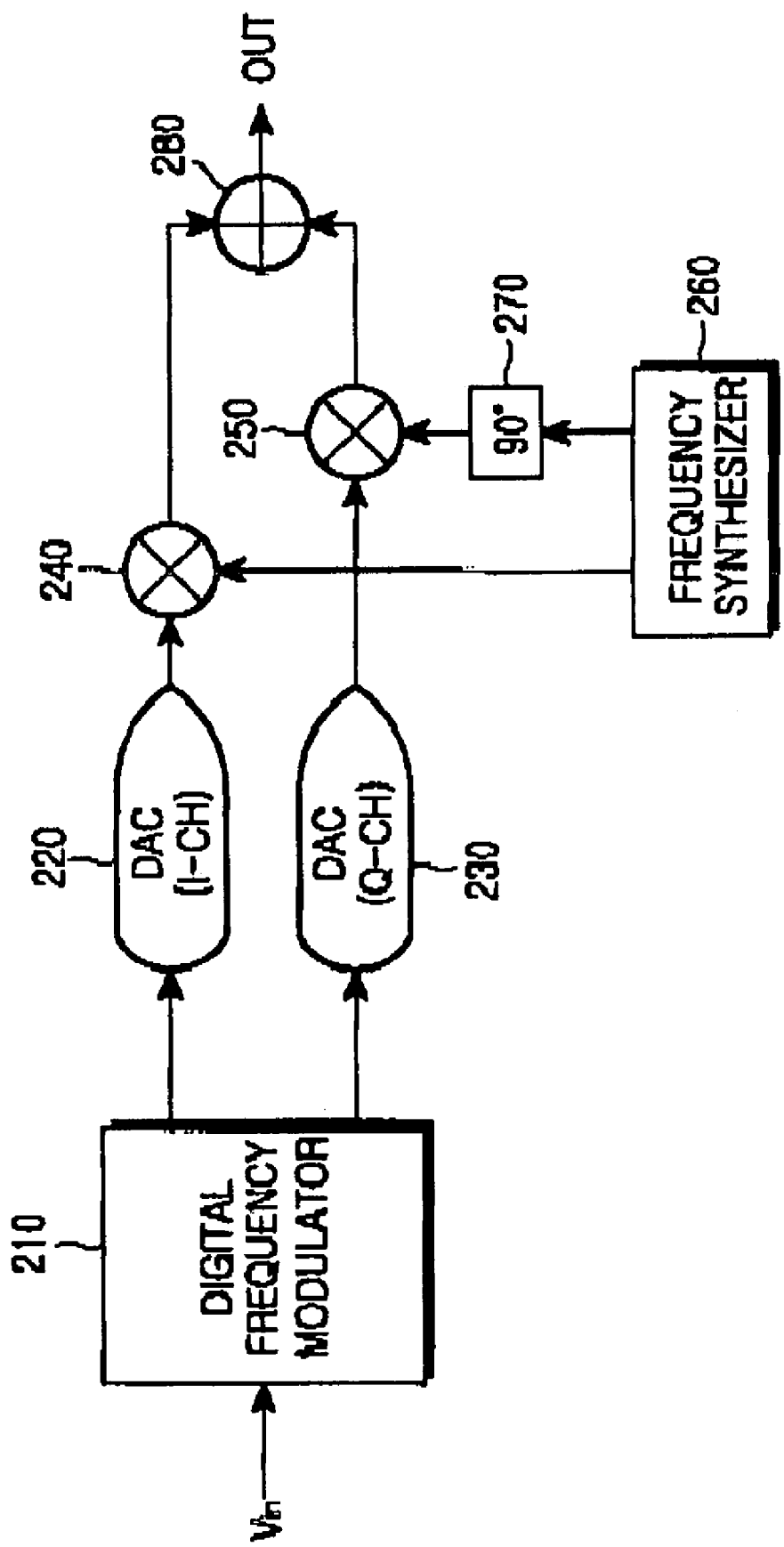
FIG. 2 is a block diagram of an FM transmitter according to the present invention.

FIG. 2 is a block diagram of an FM transmitter according to the present invention. The FM transmitter includes a digital frequency modulator 210, an in-phase DAC 220, a quadrature-phase DAC 230, an in-phase mixer 240, a quadrature-phase mixer 250, a frequency synthesizer 260, a phase converter 270, and a combiner 280.

Referring to FIG. 2, for the input of a digital signal $V_{in}$, the digital frequency modulator 210 outputs a cosine value $\cos(2\pi f_m t)$ for an in-phase (I) channel and a sine value $\sin(2\pi f_m t)$ for a quadrature-phase (Q) channel by digital processing. Here $f_m$ is a modulation frequency proportional to the voltage level of the input digital signal $V_{in}$. The in-phase DAC 220 and the quadrature-phase DAC 230 convert the cosine and sine values to analog in-phase and quadrature-phase signals having a desired frequency, respectively.

The frequency synthesizer 260 generates a carrier signal having an RF (Radio Frequency) carrier frequency. The in-phase mixer 240 feeds the carrier signal with the analog in-phase signal to the combiner 280. The quadrature-phase mixer 250 feeds a 90-degree shifted carrier signal received from the phase converter 270 with the analog quadrature-phase signal to the combiner 280. The combiner 280 combines the signals received from the in-phase and quadrature-phase mixers 240 and 250 and outputs the combined signal as an FM signal.

Figure 3:
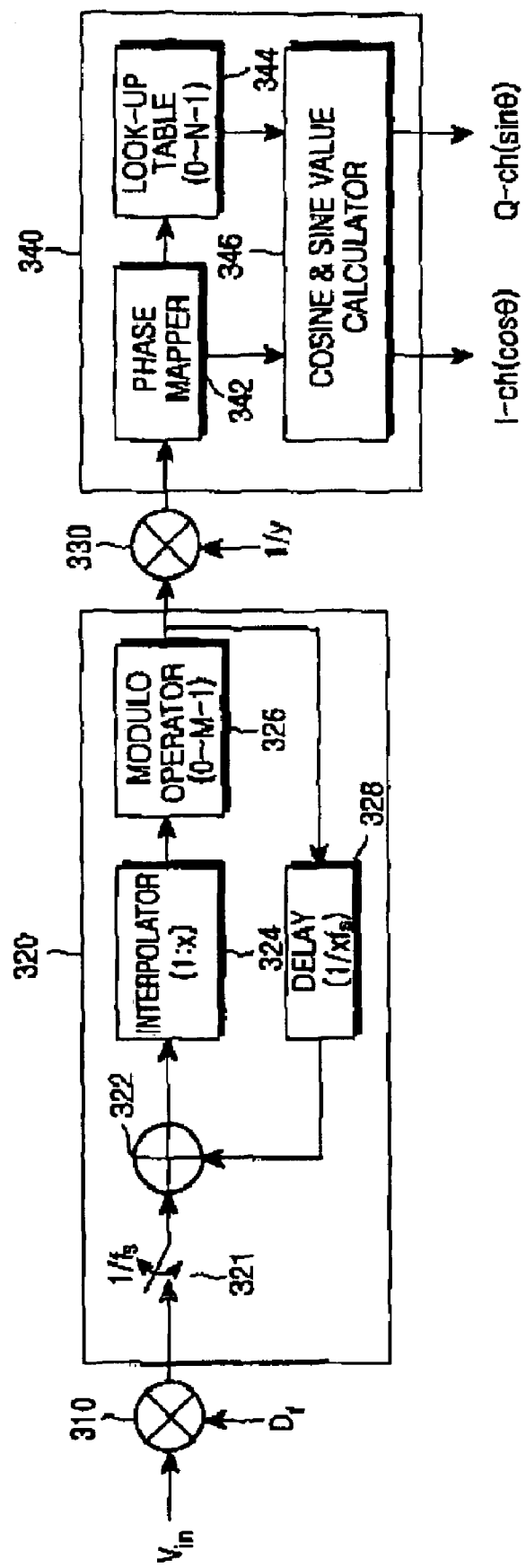
FIG. 3 is a block diagram of a digital frequency modulator according to an embodiment of the present invention.
Figure 4:
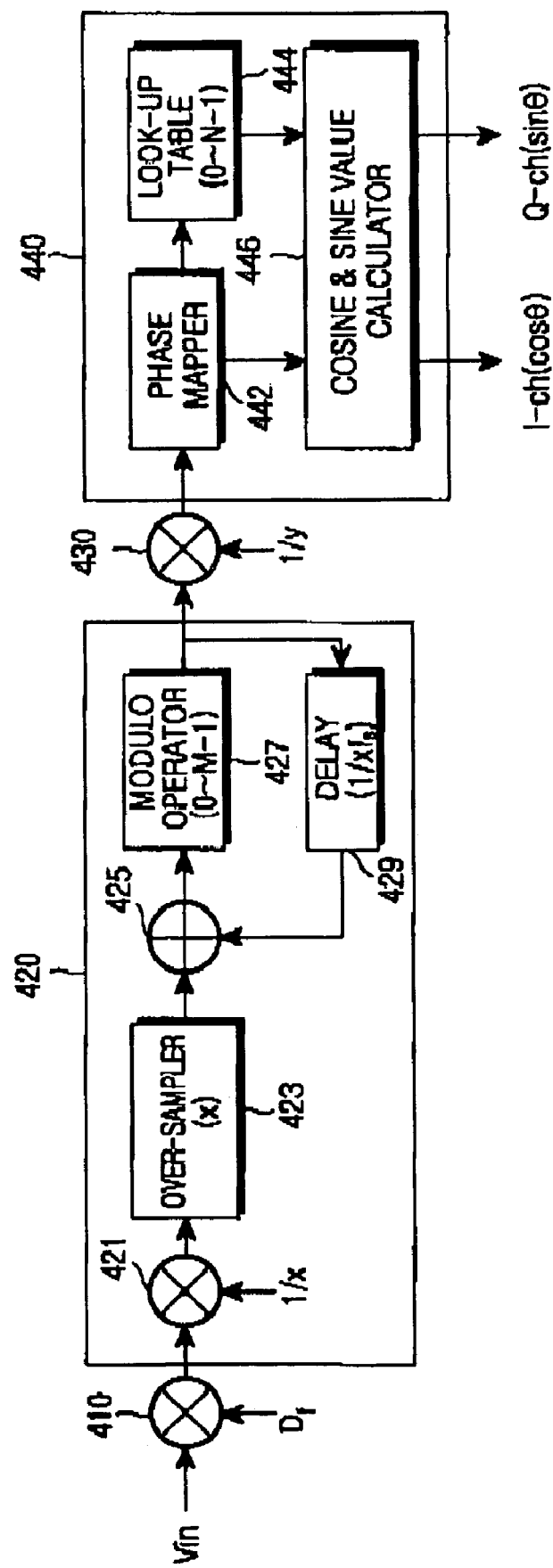
FIG. 4 is a block diagram of a digital frequency modulator according to another embodiment of the present invention.

Two embodiments of the digital frequency modulator 210 are illustrated in FIGS. 3 and 4. The digital frequency converter 210 in the embodiments accumulates the input digital signal $V_{in}$ and generates a phase accumulation and outputs cosine and sine values corresponding to the phase accumulation, referring to a look-up table.

Before describing the structure and operation of the digital frequency modulator, main parameters used herein will first be defined.

$V_{in}$: a input digital signal to the digital frequency modulator 210;

$f_s$: the input rate (frequency) of the digital signal $V_{in}$;

$D_f$: a first gain used to determine a modulation frequency;

x: interpolation rate;

M: a modulo index that determines phase resolution;

1/y: a second gain used to determine the modulation frequency;

N: the number of sine values stored in a look-up table; and $f_m$: an output frequency (i.e, modulation frequency) for the digital signal $V_{in}$.

FIG. 3 is a block diagram of the digital frequency modulator 210 according to an embodiment of the present invention. Referring to FIG. 3, the digital frequency modulator 210 includes a first gain controller 310 for firstly controlling the gain of the input digital signal $V_{in}$, a phase accumulator 320 for accumulating the first-gain controlled signal and outputting the accumulated value within a predetermined range, a second gain controller 330 for secondarily controlling the gain of the output of the phase accumulator 320, and a phase modulator 340 for outputting a cosine value for an I channel and a sine value for a Q channel that have a phase corresponding to the second-gain controlled signal.

In operation, the first gain controller 310 multiplies a digital signal $V_{in}$ of a predetermined size (e.g., 8 bits) input at a predetermined rate $f_s$ by a first gain $D_f$. The first gain $D_f$ serves to sufficiently increase the size of the digital signal $V_{in}$, to thereby represent a corresponding modulation frequency $f_m$ more accurately. The phase accumulator 320 accumulates the output of the gain controller 310 for a time period that is determined according to the input rate $f_s$ of the digital signal $V_{in}$. The accumulated signal is a phase accumulation that determines final sine and cosine values. The operation of the phase accumulator 320 will be described below.

When a switch 321 turns on, the first-gain controlled signal is applied to the input of an adder 322. The switch 321 turns on each time the digital signal $V_{in}$ is received, that is, every $1/f_s$, and it is off for the other time. The adder 322 is activated only when a signal is input to the switch 321. Upon turn-on of the switch 321, the adder 322 adds the received signal to an accumulated signal for the previous time switch 321 is on. An interpolator 324 linearly interpolates the output of the adder 322. The interpolation is performed to increase the accuracy of FM if the frequency (i.e., rate) of the digital signal $V_{in}$ is not sufficiently high. In most cases, especially when the digital signal $V_{in}$ results from sampling a voice signal, its input rate (i.e., frequency) is rather low. Therefore, the low rate is maintained before the phase accumulation is produced in order to reduce power consumption, and then the frequency is increased sufficiently when the phase accumulation is produced. To satisfy the need, the interpolator 324 increases the input rate $f_s$ of the digital signal $V_{in}$ at a predetermined interpolation rate x. The interpolation rate x is determined according to the input rate $f_s$. If $f_s$ is high, x is set to 1. As $f_s$ decreases, x is set to a greater value. If x is 1, no interpolation is performed.

More specifically, the interpolator 324 converts a digital signal received for a time T (=$1/f_s$) to x digital signals according to a predetermined interpolation rule. The interpolation rule can be linear interpolation, piece wise parabolic interpolation, or cubic interpolation. The interpolator 324 makes the output frequency of the digital frequency modulator 210 higher than the input rate $f_s$ of the digital signal $V_{in}$ by x times.

The phase accumulation is used to determine the phases of the final cosine and sine values, and ranges between 0 and 360 degrees. If M phases are defined in the range of 0 to 360 degrees, the phase accumulation must be controlled to be between 0 and (M−1). Therefore, a modulo operator 326 functions to range the phase accumulation between 0 and (M−1). M depends on a required frequency modulation performance because it determines the output of the modulo operator 326 that will be combined with an input signal at the next clock cycle and as a result, influences the phase resolution of the phase accumulation produced by the phase accumulator 320.

If the phase accumulation exceeds (M−1), the modulo operator 326 subtracts M from the phase accumulation and if it is below 0, the modulo operator 326 adds M to the phase accumulation. Consequently, the phase accumulation is maintained between 0 and (M−1). A delay 328 delays the output of the modulo operator 326 by $1/xf_s$ seconds and feeds the delayed signal back to the adder 322 and to the second gain controller 330.

Since the adder 322 is activated only when the switch 321 turns on, the delayed signal is not added until the next digital signal $V_{in}$ is input. Upon completion of interpolation in the interpolator 324, the adder 322 adds the next input signal to a signal delayed by $1/xf_s$ seconds x times, that is, by $1/f_s$ seconds in the delay 328. The second gain controller 330 multiplies the output of the phase accumulator 320 by a predetermined second gain 1/y. Thus, the actual gain of the input digital signal $V_{in}$ is $D_f/y$. The reason for controlling the gain of the digital signal $V_{in}$ twice is to reduce the number of values stored in a look-up table 344 of the phase modulator 340 and thus reduce hardware complexity and memory capacity requirement, maintaining a frequency resolution required in the phase accumulator 320.

If $2^n$ (n is an integer) is selected as y, the second gain controller 330 can be simply implemented by use of a shifter for shifting the input digital signal by a predetermined number of bits.

A phase mapper 342 in the phase modulator 340 checks upper two bits of the output of the second gain controller 330. The upper two bits represent a quadrant having a phase corresponding to the output of the second gain controller 330 on an X-Y coordinate plane. For example, if the upper two bits are 00, they indicate a first quadrant (0 to 90 degrees), if they are 01, they indicate a second quadrant (90 to 180 degrees), if they are 10, they indicate a third quadrant (180 to 270 degrees), and if they are 11, they indicate a fourth quadrant (270 to 360 degrees). The check result is fed to a cosine & sine value calculator 346.

The phase mapper 342 feeds the other bits of the output of the second gain controller 330 as a read address to the look-up table 344. According to the read address, the look-up table 344 provides a sine or cosine value having a phase represented by the output of the second gain controller 330.

Here, the look-up table 344 stores N sine or cosine values for one of the four quadrants in the X-Y coordinate plane. The cosine & sine value calculator 346 calculates final sine and cosine values corresponding to the output of the second gain controller 330 using the check result of the phase mapper 342 and the sine or cosine value read from the look-up table 344.

For example, if the look-up table 344 stores only N sine values for the first quadrant (0 to 90 degrees), the sine values can be expressed as ROM(0)=sine 0°=0 to ROM(N−1)=sine 90°32 1. Let the other bits of the output of the second gain controller 330 excluding the upper two bits be $\theta_k$. Then the cosine & sine value calculator 346 operates as illustrated in Table 1.

TABLE 1

| Upper two bits | Cosine value (I channel) | Sine value (Q channel) |
| --- | --- | --- |
| 00 | ROM(N-1-$\theta_k$) | ROM($\theta_k$) |
| 01 | −ROM($\theta_k$) | ROM(N-1-$\theta_k$) |
| 10 | −ROM(N-1-$\theta_k$) | −ROM($\theta_k$) |
| 11 | ROM($\theta_k$) | −ROM(N-1-$\theta_k$) |

The input of the phase modulator 340 must range from 0 to (4N−1). Therefore, $$M/y = 4N \quad (1)$$

where N is fixed in terms of hardware according to the size of a ROM (Read Only Memory) where the look-up table 344 is stored.

Eq. (2) to Eq. (6) below express relations between parameters related with the operation of the digital frequency modulator 210.

Equivalent Gain of Input Digital Signal $V_{in}$:

$$\frac{D_f}{y} \quad (2)$$

Phase Change in Digital Signal $V_{in}$:

$$\frac{D_f}{y} V_{in} : 4N = f_m : f_s \quad (3)$$

Output Frequency (Modulation Frequency) of Digital Signal $V_{in}$:

$$f_m = \frac{D_f f_s}{4yN} \times V_{in} \quad (4)$$

Minimum Representable Frequency (Frequency Resolution):

$$f_{min} = \frac{f_s}{M} = \frac{f_s}{4N \cdot y} \quad (5)$$

Operation Frequency of Digital Frequency Modulator: $xf_s$ (Output Rate of Cosine/Sine Value: $1/xf_s$) (6)

As noted from the above equations, a desired modulation frequency and a desired frequency resolution can be obtained by appropriately controlling the parameters y and $D_f$ in the digital frequency modulator 210.

FIG. 4 is a block diagram of the digital frequency modulator 210 according to another embodiment of the present invention. Referring to FIG. 4, the digital frequency modulator 210 includes a first gain controller 410 for firstly controlling the gain of the input digital signal $V_{in}$, a phase accumulator 420 for accumulating the first-gain controlled signal and outputting the accumulated value within a predetermined range, a second gain controller 430 for secondarily controlling the gain of the output of the phase accumulator 420, and a phase modulator 440 for outputting a cosine value for an I channel and a sine value for a Q channel which have a phase corresponding to the second-gain controlled signal. The first and second gain controllers 410 and 430 and the phase modulator 440 operate in the same manner as their respective counterparts illustrated in FIG. 3 and thus their detailed description is not provided here.

As compared to the phase accumulator 320 illustrated in FIG. 3, the phase accumulator 420 replaces the interpolator 324 with a third gain controller 421 and an oversampler 423 to realize linear interpolation.

In operation, the third gain controller 421 multiplies the first-gain controlled signal received from the first gain controller 410 by a gain 1/x. The oversampler 423 performs x-time oversampling on the output of the third gain controller 421. That is, the frequency $f_s$ of the digital signal $V_{in}$ is increased to $xf_s$ by accumulating one input x times.

An adder 425 then adds the output of the oversampler 423 to its $1/xf_s$ earlier output. Since the accumulation is used to determine the phase of sine and cosine values output from the phase modulator 440, a modulo operator 427 subtracts M from the accumulation if the accumulation exceeds (M−1), and the modulo operator 427 adds M to the accumulation if it is below 0. Consequently, the accumulation is maintained between 0 and (M−1). As described before, M is used to represent a phase between 0 and 360 degrees. A delay 429 delays the output of the modulo operator 427 by $1/xf_s$ seconds and feeds the delayed signal back to the adder 425 and to the second gain controller 430.

While the digital frequency modulator 210 is simplified because the interpolator 324 is not used, a 1/x-gain decrease before accumulation of an input signal leads to a relatively low frequency resolution in the phase accumulator 420. It is preferable to use the digital frequency modulator 210 illustrated in FIG. 4 in the case where a high frequency resolution is not required and circuit simplification is required.

The digital frequency modulator 210 according to the embodiments of the present invention outputs cosine and sine values representing the frequency component $f_m$ corresponding to an input digital signal, so that a negative baseband frequency can be generated. This digital frequency modulator is applicable to QPSK (Quadrature Phase Shift Keying) at IF (Intermediate Frequency) and RF ends.

In accordance with the present invention, performance degradation caused by the non-linearity of analog devices in a digital frequency modulator, that is, inaccuracy of an output frequency and a frequency variation range and performance change caused by environmental factors including temperature can be decreased. A frequency resolution and a modulation frequency are controlled accurately and implementation simplicity is achieved. Furthermore, the cost of analog devices in a transmitter is reduced.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A digital frequency modulator comprising:
a phase accumulator for accumulating an input digital signal and generating a phase accumulation according to a required phase resolution to output the phase accumulation within a predetermined output range, wherein the phase accumulator comprises an adder for adding the input digital signal to a previous input digital signal, an interpolator for interpolating the output of the adder at an interpolation rate determined according to the required phase resolution, a modulo operator for modulo-operating the output of the interpolator using a modulo index determined according to an output range of the phase accumulator and outputting a modulo-operated value as the phase accumulation, and a delay for delaying the output of the modulo operator by a product of a frequency of the input digital signal and the interpolation rate and outputting a delayed signal as the previous input digital signal to the adder;
a phase modulator for outputting cosine and sine values corresponding to a gain multiplied phase accumulation;
a first gain controller for multiplying a digital signal by a first gain determined according to a required modulation frequency to generate the input digital signal input to the phase accumulator; and
a second gain controller for multiplying the phase accumulation by a second gain determined according to the required modulation frequency and the first gain to generate the gain multiplied phase accumulation input to the phase modulator.

2. The digital frequency modulator of claim 1, wherein the interpolation rate is inversely proportional to the frequency of the input digital signal.

3. A digital frequency modulator comprising:
a phase accumulator for accumulating an input digital signal, and generating a phase accumulation according to a required phase resolution, and outputting the phase accumulation within a predetermined output range;
a phase modulator for outputting cosine and sine values corresponding to a gain multiplied phase accumulation;
a first gain controller for multiplying a digital signal by a first gain determined according to a required modulation frequency, to generate the input digital signal input to the phase accumulator; and
a second gain controller for multiplying the phase accumulation by a second gain determined according to the required modulation frequency and the first gain, to generate the gain multiplied phase accumulation is input to the phase modulator, wherein the phase accumulator comprises:
a third gain controller for multiplying the input digital signal by a gain determined according the required phase resolution;
an oversampler for oversampling the output of the third gain controller at a sampling rate determined according to the gain;
an adder for adding the oversampled signal to a previous oversampled signal;
a modulo operator for modulo-operating the output of the adder using a modulo index determined according to an output range of the phase accumulator and outputting a modulo-operated value as the phase accumulation; and
a delay for delaying the output of the modulo operator by a product of a frequency of the input digital signal and the sampling rate and outputting the delayed signal as the previous oversampled signal to the adder.

4. The digital frequency modulator of claim 3, wherein the gain is proportional to the frequency of the input digital signal.

5. The digital frequency modulator of claim 4, wherein the sampling rate is a reciprocal of the gain.

6. The digital frequency modulator of claim 1, wherein the phase modulator comprises:
a phase mapper for determining from an upper two most significant bits of the phase accumulation a quadrant in which a phase corresponding to the phase accumulation is located on an X-Y coordinate plane;
a look-up table for storing a predetermined number of sine or cosine values for one of four determined quadrants of the X-Y coordinate plane, and outputting a sine or cosine value according to bits of the phase accumulation other than the upper two most significant bits; and
a cosine and sine value calculator for calculating the sine and cosine values having a phase corresponding to the phase accumulation according to the determined quadrant and the sine or cosine value received from the look-up table.

7. The digital frequency modulator of claim 6, wherein the interpolation rate is inversely proportional to the frequency of the input digital signal.

8. The digital frequency modulator of claim 6, wherein the phase accumulator further comprises:
a third gain controller for multiplying the input digital signal by a gain determined according the required phase resolution; and
an oversampler for oversampling the output of the third gain controller at a sampling rate determined according to the gain.

9. The digital frequency modulator of claim 8, wherein the gain is proportional to the frequency of the input digital signal.

10. The digital frequency modulator of claim 9, wherein the sampling rate is a reciprocal of the gain.

11. A digital frequency modulator comprising:
a phase accumulator for accumulating an input digital signal and generating a phase accumulation according to a required phase resolution to output the phase accumulation within a predetermined output range, the phase accumulator including an adder for adding the input digital signal to a previous input digital signal, an interpolator for interpolating the output of the adder at a interpolation rate determined according to the required phase resolution, a modulo operator for modulo-operating the output of the interpolator using a modulo index determined according to an output range of the phase accumulator and outputting a modulo-operated value as the phase accumulation, and a delay for delaying the output of the modulo operator by the product a frequency of the input digital signal and the interpolation rate and outputting the delayed signal as the previous input digital signal to the adder; and
a phase modulator for outputting cosine and sine values corresponding to the phase accumulation.

12. A digital frequency modulator comprising:
a phase accumulator for accumulating an input digital signal, and generating a phase accumulation according to a required phase resolution, and outputting the phase accumulation within a predetermined output range, wherein the phase accumulator comprises an adder for adding the input digital signal to a previous input digital signal, an interpolator for interpolating the output of the adder at an interpolation rate determined according to the required phase resolution, a modulo operator for modulo-operating the output of the interpolator using a modulo index determined according to an output range of the phase accumulator and outputting the modulo-operated value as the phase accumulation, and a delay for delaying the output of the modulo operator by a product of a frequency of the input digital signal and the interpolation rate and outputting the delayed signal as the previous input digital signal to the adder; and a phase modulator for outputting cosine and sine values corresponding to the phase accumulation, the phase modulator including a phase mapper for determining from an upper two most significant bits of the phase accumulation a quadrant in which a phase corresponding to the phase accumulation is located on an X-Y coordinate plane, a look-up table for storing a predetermined number of sine or cosine values for one of four determined quadrants of the X-Y coordinate plane, and outputting a sine or cosine value according to bits of the phase accumulation other than the upper two most significant bits, and a cosine and sine value calculator for calculating the sine and cosine values having a phase corresponding to the phase accumulation according to the determined quadrant and the sine or cosine value received from the look-up table.

* * * * *